United States Patent [19]

Takemura

[11] Patent Number: 5,175,141

[45] Date of Patent: Dec. 29, 1992

[54] SUPERCONDUCTING CERAMIC FILM STRUCTURE AND MANUFACTURING METHOD FOR THE SAME

[75] Inventor: Yasuhiko Takemura, Atsugi, Japan

[73] Assignee: Semiconductor Energy Laboratory Co., Ltd., Atsugi, Japan

[21] Appl. No.: 406,056

[22] Filed: Sep. 12, 1989

[30] Foreign Application Priority Data

Sep. 22, 1988 [JP] Japan .................. 63-239257

[51] Int. Cl.⁵ .............................. B32B 3/00
[52] U.S. Cl. ........................ 505/1; 505/701; 505/702; 505/703; 505/704; 428/688; 428/901; 428/930
[58] Field of Search .............. 505/1, 701–704; 428/688, 901, 930

[56] References Cited

PUBLICATIONS

Kan et al., Journal of Materials Research, vol. 5, No. 4, Apr. 1990 p. 731.
Lee et al. Journal of Materials Research, vol. 5, No. 7, Jul. 1990.
Superconductivity of Screen Printed Yba2 Co3Oy Thick Film on Y2BaCuO5 Substrates, Jap. Journ. Appl. Phys. vol. 27, No. 8 pp. 21492-21494, Aug. 1988.
Formation of High Tc YBa2Cu3O7-8 Films on Y2Ba CuO5 Substrate, Wans et al. Jap. Journ. Appl. Phys, vol. 27, No. 7, pp. L1268-L1270 Jul. 1988.
CA112(4): 28875u, Matei, Res. Symp Proc., 143–9 1988 Gai et al.

Primary Examiner—Patrick J. Ryan
Assistant Examiner—T. A. Powers
Attorney, Agent, or Firm—Sixbey, Friedman, Leedom & Ferguson

[57] ABSTRACT

Bi-based superconducting ceramic films having high Tc's and high critical current densities are formed. The superconducting film is formed on a non-superconducting saubstrate of $Bi_2Sr_{1-x}Ca_xO_y$. Due to crystalline similarity between the superconducting film and the underlying ceramic substrate, the crystalline structure of the film is improved. There are few impurities which contaminate the superconducting film since the constituent elements of the substrate are also the consitutents of the superconducting film.

3 Claims, 2 Drawing Sheets

⊗ : Bi    ⦀ : Sr or Ca    • : Cu    ◯ : O

SUPERCONDUCTING CERAMIC FILM STRUCTURE AND MANUFACTURING METHOD FOR THE SAME

BACKGROUND OF THE INVENTION

The present invention relates to superconducting ceramic film structure and manufacturing method for the Same.

Bi-based superconducting ceramics are well-known in the field as high-Tc materials. There are two types of superconducting phases of these ceramics, i.e. a low Tc phase in which Tc is up to 80° K. and a high Tc phase in which Tc is up to 110° K. The low Tc phase is realized by ceramic materials of $Bi_2Sr_2CaCu_2O_{8+z}$ whose c-axis length is 30 Å. The high Tc phase is realized by ceramic material of $Bi_2Sr_2Ca_2Cu_3O_{10+z}$ whose c-axis length is 36 Å.

It is well-known that single crystalline magnesium oxide is suitable for providing a substrate on which Bi-based superconducting ceramic thin and thick films are formed. The radius of magnesium ion, however, is close to that of Cu ion so that the replacement of Cu sites by Mg ions is likely and degrades the superconductivity.

SUMMARY OF THE INVENTION

It is therefore an object of the present invention to provide improved superconducting ceramic film structures and a method for forming the same.

In order to accomplish the above and other objects and advantages, the present invention proposes to replace the single crystalline Mg substrate, on which Bi-based superconducting ceramic films are formed, by a $Bi_2Sr_{1-x}Ca_xO_y$ ($x=0-1$, $y=3-4$, called BSCO hereinafter) substrate which possesses a similar crystalline structure as the Bi-based superconducting ceramics. Superconducting films of $Bi_2Sr_2CaCu_2O_{8-z}$ or $Bi_2Sr_2Ca_2Cu_3O_{10+z}$ are formed on the BSCO substrates. The advantages of the use of this ceramic substrate are as follows:

(1) The crystalline structure is similar to that of Bi-based ceramics. The a-axis length thereof is 5.4 Å like the Bi-based superconducting ceramics (those of the low Tc phase and the high Tc phase are both 5.4 Å). This fact is advantageous when the superconducting ceramic material of crystalline structure is desired to epitaxially grow on the substrate. FIGS. 1(A), 1(B) and 1(C) are schematic illustrations showing the crsytalline structures of BSCO, a Bi-based superconducting ceramic in the low Tc phase and a Bi-based superconducting ceramic in the high Tc phase. As seen from the figures, the structure of BSCO is such that a Sr-O plane, Cu-O and Ca-O planes are removed from the Bi-based superconducting structure. The c-axis length of BSCO is 18 Å which is a half that of the Bi-based superconducting ceramics. By this structure, it has been confirmed by experiments that the Bi-based superconducting ceramics are grown on the substrate selectively in the high-Tc phase.

(2) The BSCO material consists of constituents which are also the constituents of the Bi-based supercoducting ceramics. For this reason, the contamination of the superconducting ceramics due to other impurities is effectively avoided.

BRIEF DESCRIPTION OF THE DRAWING

This invention can be better understood from the following detailed description when read in conjunction with the drawing in which.

DETAILED DESCRIPTION OF THE PREFERRED EMBODIMENTS

Prescribed amounts of powders of $Bi_2O_3$, $SrCO_3$ and $CaCO_3$ of 99.9% or higher purity respectively were sufficiently mixed in the ratio of Bi:Sr:Ca=2:0.7:3 and fired at 850° C. for 12 hours in air, followed by compacting into a disk form of 20 mm diameter and 1 mm thickness. The ceramic disk is fired again in air at 850° C. for 12 hours. It was confirmed that the fine powder was in single phase of BSCO ($Bi_2Sr_{1-x}Ca_xO_y$) by the x-ray analysis.

Figure 1A:
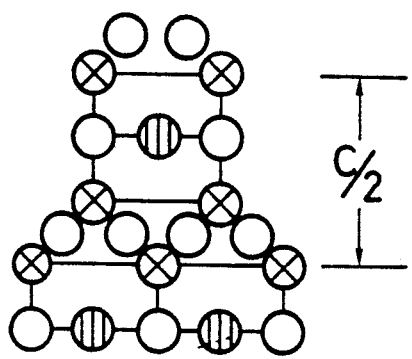
FIGS. 1(A), 1(B) and 1(C) are schematic illustrations showing crystalline structures of a BSCO substrate, a Bi-based low Tc superconducting ceramic and a Bi-based high Tc superconducting ceramic in accordance with the present invention.
Figure 1B:
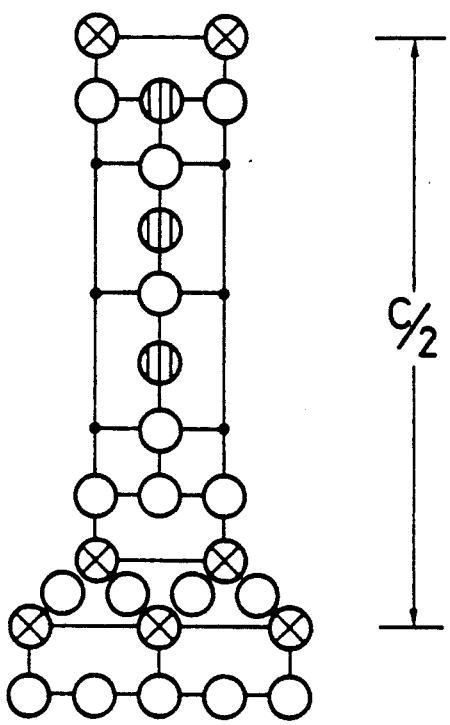
Figure 1C:
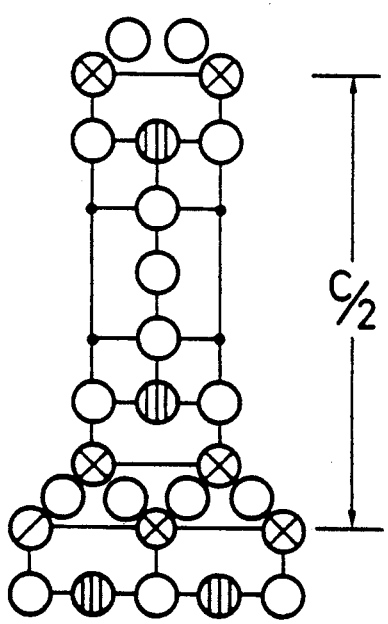
Figure 2:
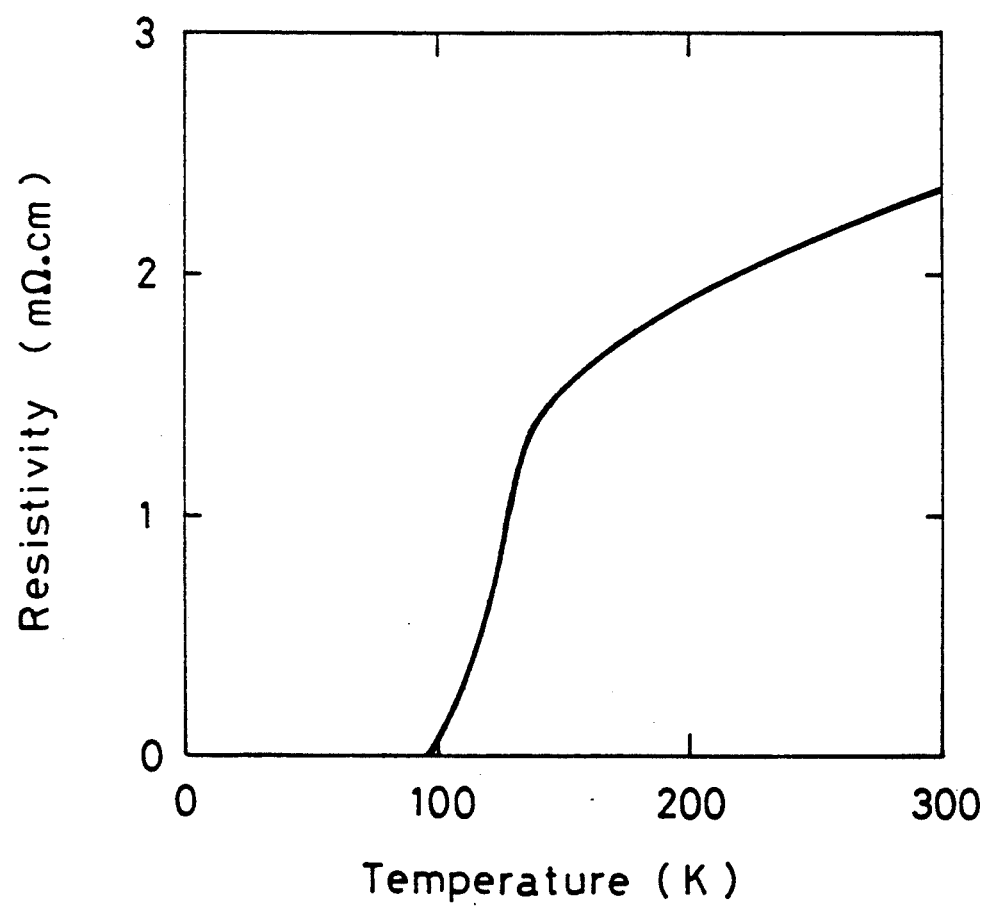
FIG. 2 is a graphical diagram showing the resistivity of a superconducting film versus the temperature in accordance with the present invention.

Next, a Bi-based superconducting ceramic film is formed on the BSCO disk. Prescribed amounts of powders of $BiO_3$, $SrCO_3$, $CaCO_3$ and $CuO$ of 99.9% or higher purity respectively were sufficiently mixed in the ratio of Bi:Sr:Ca:Cu=2:2:2:3 and fired at 800° C. for 12 hours. The fired ceramic material was ground to have a powder average size of 1 to 5 micrometers. The fine powder was added to and dispersed in ethylalcohol in order to prepare a superconducting paste. The paste was applied on the BSCO disk by screen press printing technique to a thickness of 50 micrometers. After dried, the printed film was heated at 880° C. for 30 minutes in air followed by gradually cooling at 60° C./hour to room temperature. As a result, a superconducting cermic film of 30 micrometers thickness was obtained. FIG. 2 shows the resistivity versus the temperature. As seen from the figure, the critical temperature of the superconducting film was measured to be about 100° C. The superconducting current critical density was measured to be 10000 A/cm². These figures are relatively large as compared to those obtained by conventional method of forming superconducting films. This improvement is considered as attributed to the fact that the high Tc phase is prevailing the superconducting film due to the underlying BSCO surface (this was found by X-ray diffraction analysis) and that few impurity atoms enter the superconducting film since the underlying surface is composed only of constituent elements which are also constituents of the overlying superconducting film.

While several embodiments have been specifically described by way of examples, it is to be appreciated that the present invention is not limited to the particular examples described and that modifications and variations can be made without departing from the scope of the invention as defined by the appended claims. For example, the superconducting films can be formed by other methods such as vacuum evaporation, electron beam evaporation, reactive gas evaporation, chemical vapor deposition and spray pyrolysis.

What is claimed is:

1. A superconducting ceramic film structure comprising a non-superconducting ceramic substrate represented by the formula $Bi_2Sr_{1-x}Ca_xO_y$ x=0-1, y=3-4 and a crystalline high-temperature superconducting ceramic film comprising Bi, Sr, Ca, Cu, and O formed on said substrate.

2. The ceramic film structure of claim 1 wherein the ceramic material of said superconducting film is represented by the formula of $Bi_2Sr_2CaCu_2O_{8-z}$ or $Bi_2Sr_2Ca_2Cu_3O_{10-z}$.

3. A superconducting layer structure comprising a non-superconducting ceramic layer represented by the formula $Bi_2Sr_{1-x}Ca_xO_y$ (x=0-1, y=3-4) and a superconducting ceramic layer represented by one of the formulas $Bi_2Sr_2CaCu_2O_{8+z}$ and $Bi_2Sr_2Ca_2Cu_3O_{10-z}$ formed on said ceramic substrate.

* * * * *